United States Patent
Ha et al.

(10) Patent No.: US 8,895,936 B2
(45) Date of Patent: Nov. 25, 2014

(54) PIXEL ARRAY AND IMAGE SENSOR INCLUDING THE SAME

(75) Inventors: Man Lyun Ha, Chungcheongbuk-do (KR); Ju Il Lee, Seongnam-si (KR); Sun Choi, Icheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 265 days.

(21) Appl. No.: 13/342,437

(22) Filed: Jan. 3, 2012

(65) Prior Publication Data

US 2012/0187304 A1 Jul. 26, 2012

(30) Foreign Application Priority Data

Jan. 26, 2011 (KR) .................... 10-2011-0007647

(51) Int. Cl.
*G01T 1/24* (2006.01)
*H04N 5/3745* (2011.01)
*H01L 27/146* (2006.01)

(52) U.S. Cl.
CPC ..... *H01L 27/14603* (2013.01); *H01L 27/14625* (2013.01); *H01L 27/14609* (2013.01); *H04N 5/3745* (2013.01); *H01L 27/14627* (2013.01)
USPC .................................................. 250/370.01

(58) Field of Classification Search
CPC ............... H04N 5/335; H01L 27/1461; H01L 27/14612; G09G 3/3233
USPC .................................................. 250/370.01
See application file for complete search history.

(56) References Cited

U.S. PATENT DOCUMENTS

| | | | |
|---|---|---|---|
| 7,863,936 B1 * | 1/2011 | Liu et al. | 326/86 |
| 2004/0217396 A1 * | 11/2004 | Lee | 257/292 |
| 2008/0186724 A1 * | 8/2008 | Lynam et al. | 362/494 |
| 2010/0116999 A1 * | 5/2010 | Tumer et al. | 250/370.13 |
| 2010/0245637 A1 * | 9/2010 | Itonaga | 348/273 |

FOREIGN PATENT DOCUMENTS

| | | | |
|---|---|---|---|
| JP | 2001-337170 A | | 12/2001 |
| JP | 2010074631 A | * | 4/2010 |
| KR | 10-2010-0073786 A | | 7/2010 |
| KR | 10-2010-0077564 A | | 7/2010 |

* cited by examiner

*Primary Examiner* — David Porta
*Assistant Examiner* — Abra Fein
(74) *Attorney, Agent, or Firm* — Andrew D. Fortney; Central California IP Group, P.C.

(57) ABSTRACT

A pixel array and an image sensor including the pixel array having improved sensitivity and can drive pixels with high resolution, according to embodiments. In embodiments, a pixel array may include a plurality of pixels having a pixel area and a logic area. The pixel array may include at least one of: (1) A photoelectric conversion unit in the pixel area of each of the pixels. (2) A pixel-area transistor disposed at a side of the photoelectric conversion unit in the pixel area. (3) A metal-0 layer on the pixel-area transistor. (4) A metal-1 layer on and/or over the metal-0 layer. (5) A light reception unit on and/or over the metal-1 layer, with the metal-1 layer being the top metal layer in the pixel area.

20 Claims, 20 Drawing Sheets

PIXEL ARRAY AND IMAGE SENSOR INCLUDING THE SAME

CROSS-REFERENCE TO RELATED APPLICATIONS

This application claims priority under 35 U.S.C. §119 to Korean Patent Application No. 10-2011-0007647, filed Jan. 26, 2011, which is hereby incorporated by reference in its entirety.

BACKGROUND

Image sensors are semiconductor devices for converting optical images into electrical signals. Two general types of image sensors are charge coupled devices (CCDs) and complementary metal oxide silicon (CMOS) image sensors (CISs). CMOS image sensors are devices for digitizing light using imaging technology. In a unit pixel of a CMOS image sensor, a photo diode and a MOS transistor are formed to sequentially and may detect electrical signals by a switching method to form an image.

A metal-0 layer may be formed under a first metal layer. Metal-0 layer may be used as a local interconnection (LIC) for connecting floating diffusion nodes or connecting a source (e.g. a source follower SF) to a drain of a select transistor Select Tr. The resulting pixel layout generally has a layout structure using a layer having at least metal-2 (e.g. at least three metal layers). However, a stack structure having up to a metal-2 layer (e.g. having at least three metal layers) in a relatively small pixel (e.g. such as a 1.4 µm pixel) may have problems such as sensitivity limitations and/or high processing costs.

SUMMARY

Embodiments relate to a pixel array and an image sensor including the pixel array. Embodiments relate to a pixel array having an improved sensitivity. Embodiments relate to a pixel array which can drive pixels with high resolution. Embodiments relate to a pixel array which can have improved manufacturing costs and implement a high resolution image sensor.

In embodiments, a pixel array may include a plurality of pixels having a pixel area and a logic area. The pixel array may include at least one of: (1) A photoelectric conversion unit in the pixel area of each of the pixels. (2) A pixel-area transistor disposed at a side of the photoelectric conversion unit in the pixel area. (3) A metal-0 layer on the pixel-area transistor. (4) A metal-1 layer on and/or over the metal-0 layer. (5) A light reception unit on and/or over the metal-1 layer, with the metal-1 layer being the top metal layer in the pixel area.

In embodiments, an image sensor may include a pixel array including a plurality of pixels having a pixel area and a logic area and a pixel gate driver disposed at a side of the pixel array. The pixel array may include at least one of: (1) A photoelectric conversion unit in the pixel area of each of the pixels. (2) A pixel-area transistor disposed at a side of the photoelectric conversion unit in the pixel area. (3) A metal-0 layer on and/or over the transistor of the pixel area. (4) A metal-1 layer on and/or over the metal-0 layer. (5) A light reception unit on and/or over the metal-1 layer, with the metal-1 layer being the top metal of the pixel area.

BRIEF DESCRIPTION OF THE DRAWINGS

Example

Example

Example

Example

Example

Example

Example

Example

Example

Example

Example

Example

Example

Example

Example

Example

DETAILED DESCRIPTION OF THE EMBODIMENTS

Embodiments relate to a pixel array and an image sensor including the pixel array. In the description of the embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1A:
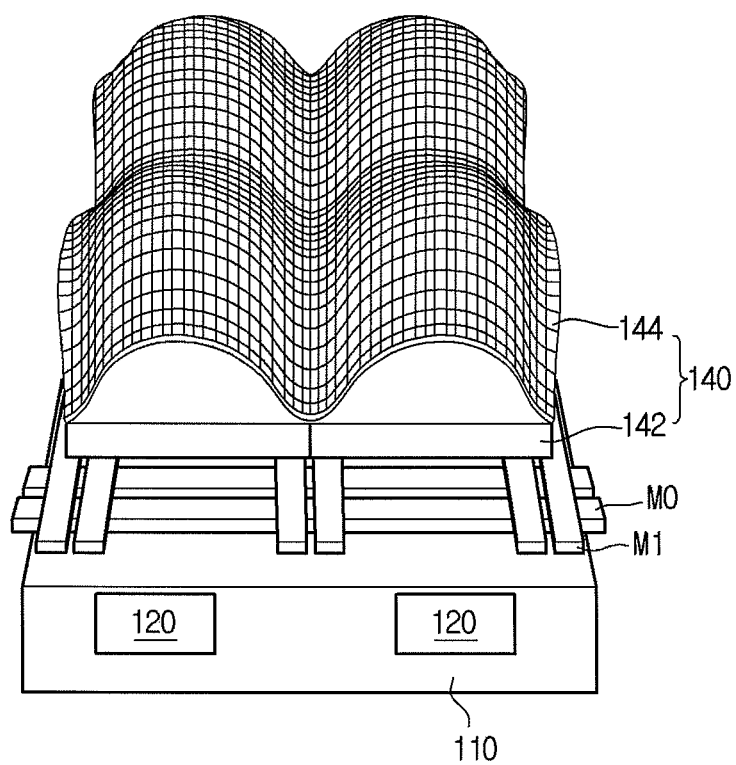
FIG. 1A is a projection view of a pixel array, in accordance with embodiments.
Figure 1B:
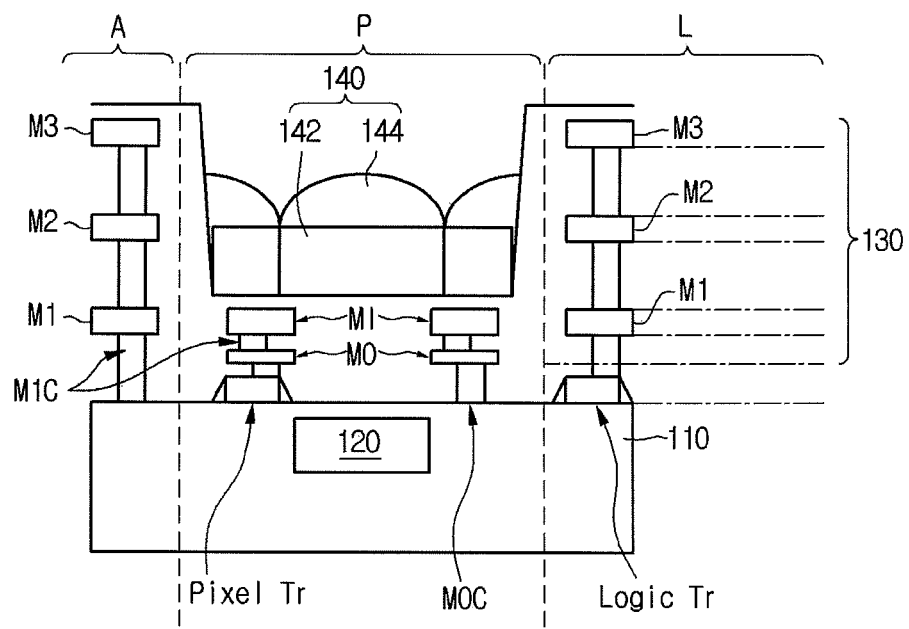
FIG. 1B is a cross sectional view of an image sensor, in accordance with embodiments.

Example FIG. 1A is a projection view of a pixel array, in accordance with embodiments. Example FIG. 1B is a cross sectional view of an image sensor, in accordance with embodiments. A pixel array (according to embodiments) may include a plurality of pixels having a pixel area P and a logic area L. The pixel array may include at least one of: (1) A photoelectric conversion unit 120 formed in pixel area P for each pixel. (2) A pixel-area transistor Pixel Tr disposed at a side of the photoelectric conversion unit 120 in pixel area P. (3) A metal-0 layer M0 formed on transistor Pixel Tr. (4) A metal-1 layer M1 formed on and/or over metal-0 layer M0. (5) A light reception unit 140 formed on and/or over metal-1 layer M1, the metal-1 layer M1 being a top (e.g. upper-most) metal of pixel area P.

In embodiments, photoelectric conversion unit 120 may be a photodiode, although but other embodiments may include other types of devices performing similar functions. In accordance with embodiments, light reception unit 140 may include a color filter 142 and/or microlens 144, but other embodiments may include other types of devices performing similar functions.

In embodiments, no metal layers may exist between metal-1 layer M1 (e.g. as the top metal) and light reception unit 140. Likewise, in embodiments, no metal layers may exist between metal-0 layer M0 and metal-1 layer M1. Metal-0 contact M0C may be disposed between metal-0 layer M0 and substrate 110 in a pixel area. Metal-0 layer M0 may electrically connect pixel-area transistors Pixel Tr of the pixels.

In accordance with embodiments (e.g. embodiments illustrated in FIG. 8B), through-silicon-via (TSV) 170 may be landed as wiring for metal-0 layer M0. Since metal-0 layer M0 may be formed from about 500 Å to about 2,000 Å, the landing of the metal contact may be effectively progressed. In embodiments, if the thickness is below 500 Å, metal-0 layer M0 may not function as an etch stop layer for a through-silicon-via (TSV) in a multichip module process. Further, if the thickness of metal-0 layer M0 is more than 2,000 Å, capacitance may excessively increase with a decrease in a distance from the metal-1 layer. When the distance from the metal-1 layer increases to decrease the capacitance, the stack height of the image sensor may become greater.

In embodiments, an image sensor of a multichip module package (PKG) type may be implemented between a chip wafer (chip/WF) having only a readout IC and a chip wafer (chip/WF) having only a pixel block. For example, the metal-0 layer may be used as an etch stop layer for a through-silicon-via (TSV), thereby implementing an image sensor of a multichip module PKG type between the two chip wafer (chip/WF) after separately manufacturing the pixel block and the readout IC block, in accordance with embodiments. In embodiments, the metal-0 layer M0 may function as a global interconnection (GIC) between transistors of pixel area P.

For example, the metal-0 layer may be used not as a local interconnection (LIC) for connecting FD nodes of small areas, but as a global interconnection (GIC) for electrically connecting pixel-area transistors of pixels, thus a pixel layout may be implemented using only up to the metal-1 layer. Accordingly, the stack height from the photodiode to microlens of a pixel may significantly decrease, thereby improving the sensitivity of the image sensor (e.g. in a small pixel). For example, metal-0 layer may be formed under metal-1 layer through a tungsten damascene process used as a global interconnection (GIC).

Logic area L may be formed at a side of pixel area P. In logic area L, transistor Logic Tr of the logic area may be formed. A plurality of interlayer dielectric layers 130 may be formed on the top of the transistor. A plurality of metals or contacts may be formed in each of the interlayer dielectric layers 130. For example, the metal of logic area L may include metal 1 M1, metal 2 M2, and/or metal 3 M3, although other mixes and combinations are appreciated in other embodiments. The contact of logic area L may include contact 1 M1C, contact 2, and contact 3, although other mixes and combinations are appreciated in other embodiments. Analog area A may be formed at another side of the pixel area P, although other arrangements are appreciated in other embodiments.

Figure 2A:
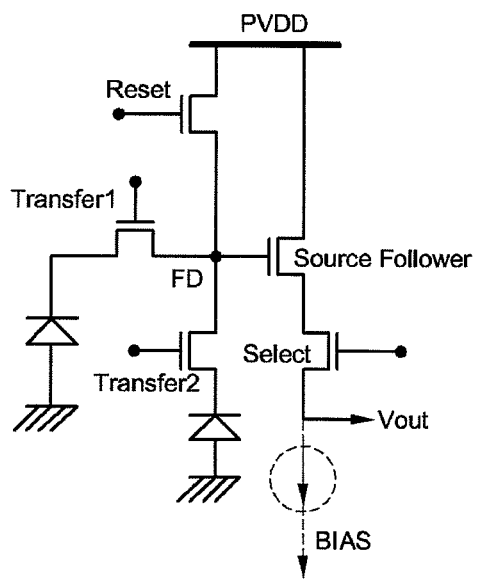
FIG. 2A is an exemplary view of a driving circuit of an image sensor, in accordance with embodiments.
Figure 2B:
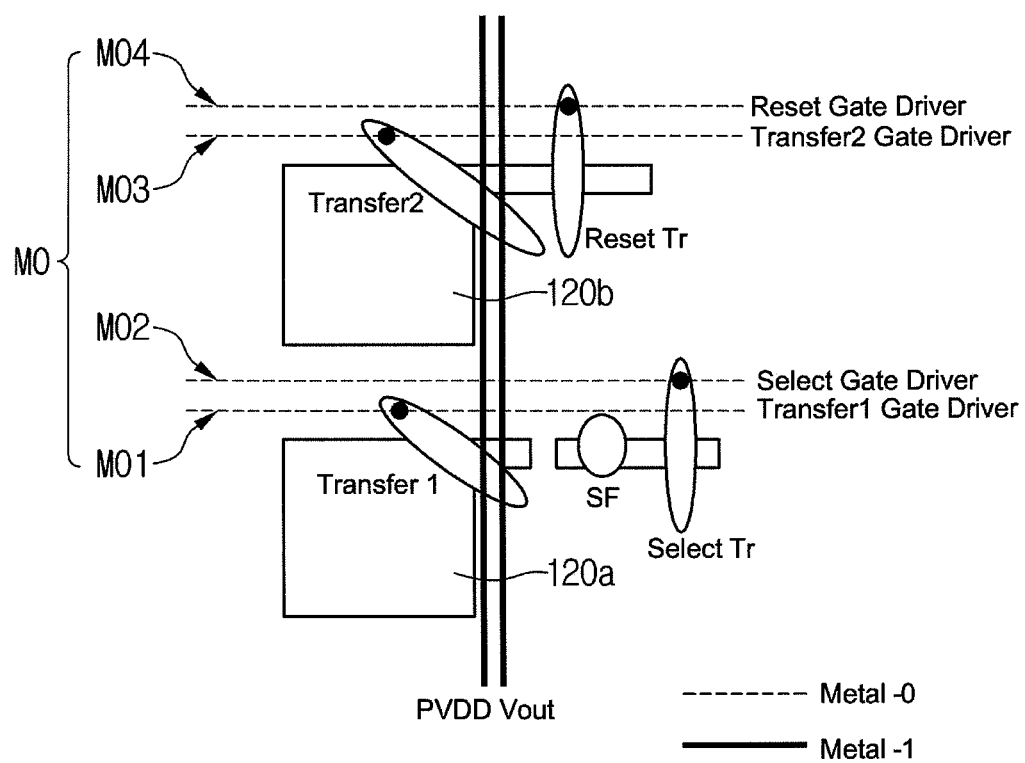
FIG. 2B is an exemplary view of a layout of the image sensor, in accordance with embodiments.

Example FIG. 2A is an exemplary view of a driving circuit in an image sensor, in accordance with embodiments. Example FIG. 2B is an exemplary view of a layout of an image sensor, in accordance with embodiments. In accordance with embodiments. a pixel array may include first photodiode 120a, second photodiode 120b, first transfer transistor Transfer 1, second transfer transistor Transfer 2, reset transistor Reset Tr, source follower SF, and/or select transistor Select Tr.

In a pixel array and image sensor according to embodiments, metal-0 layer may electrically connect pixel-area transistors of pixels. For example, in embodiments, metal-0 layer M0 may include at least one of the following: (1) First metal-0 layer M01 connecting gates of the first transfer transistors Transfer 1 for the plurality of pixels. (2) Second metal-0 layer M02 connecting gates of the select transistors Select Tr for the plurality of pixels. (3) Third metal-0 layer M03 connecting gates of the second transfer transistors Transfer 2 for the plurality of pixels. (4) Fourth metal-0 layer M04 connecting gates of the reset transistors Reset Tr for the plurality of pixels.

First photodiode 120a and second photodiode 120b may share a floating diffusion area (FD). For example, the first transfer transistor and the second transfer transistor may be electrically connected to the floating diffusion area (FD) by the metal-0 layer or metal-1 layer, although other embodiments may have different variations.

The first metal-0 layer M01 may be connected with the first transfer transistor Transfer 1 using a contact. The second metal-0 layer M02 may be connected with the select transistor Select Tr using a contact. The third metal-0 layer M03 may be connected with the second transfer transistor Transfer 2 using a contact. The fourth metal-0 layer M04 may be connected with the reset transistor Reset Tr using a contact. The first metal-0 layer M01 may not be connected with the select transistor Select Tr. The third metal-0 layer M03 may not be connected to the reset transistor Reset Tr.

According to embodiments, metal-0 layer may not be used as a local interconnection (LIC), but as a global interconnection (GIC). Accordingly, the top metal of the pixel area may be formed only up to the metal-1 layer. The stack height from the photodiode to microlens of a pixel may be decreased significantly, which may improve the sensitivity of the image sensor, in which may be particularly important for a small pixel.

Figure 3A:
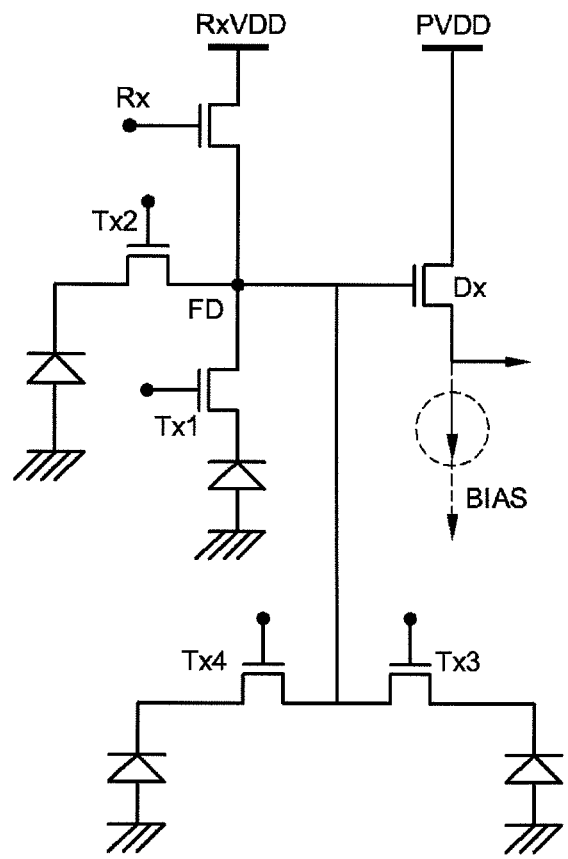
FIG. 3A is an exemplary view of a driving circuit of an image sensor, in accordance with embodiments.
Figure 3B:
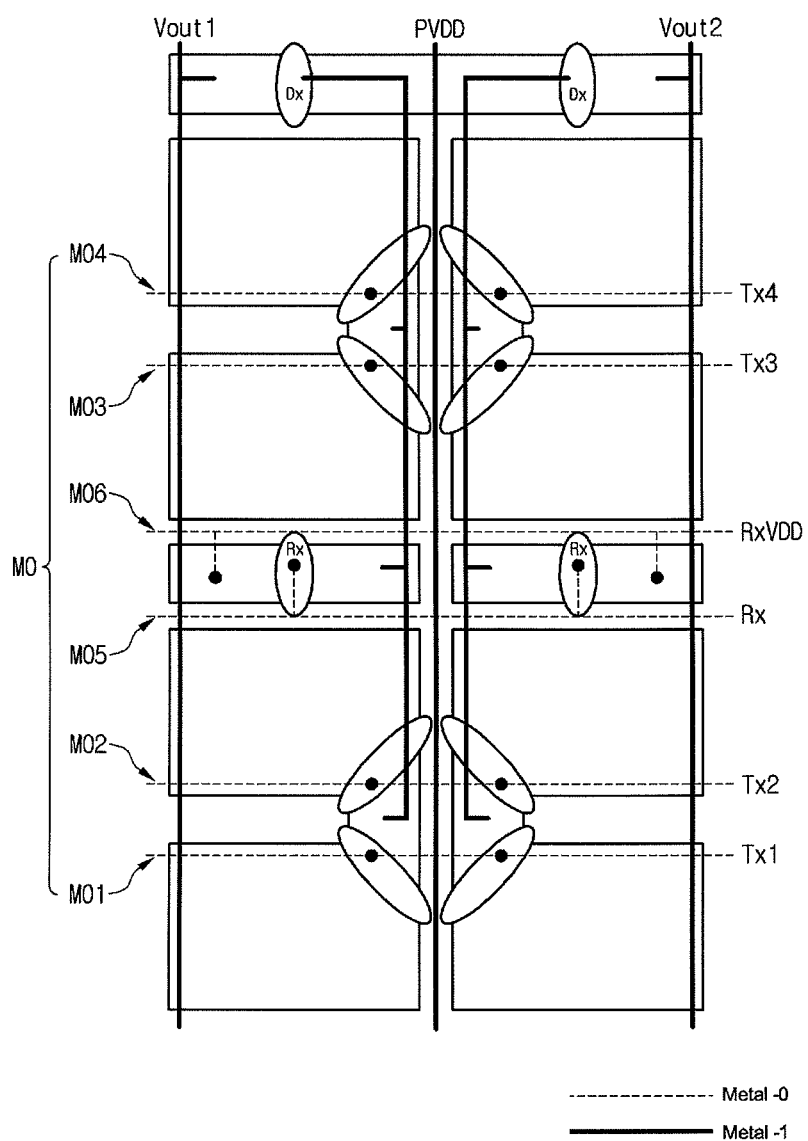
FIG. 3B is an exemplary view of a layout of an image sensor, in accordance with embodiments.

Example FIG. 3A is an exemplary view of a driving circuit in an image sensor, in accordance with embodiments. Example FIG. 3B is an exemplary view of a layout of an image sensor, in accordance with embodiments. A pixel array and image sensor, according to embodiments, may have no select transistor and/or share 4 pixels.

According to embodiments, the pixel array and image sensor may include at least one of: a first transfer transistor Tx1, a second transfer transistor Tx2, a third transfer transistor Tx3, a fourth transfer transistor Tx4, a reset transistor Rx, and a drive transistor Dx, although embodiments appreciate different mixes and combinations of components. In embodiments, a metal-0 layer M0 may electrically connect pixel-area transistors of pixels.

For example, in embodiments, metal-0 layer M0 may include at least one of: (1) First metal-0 layer M01 connecting gates of first transfer transistors Tx1 for a plurality of pixels. (2) Second metal-0 layer M02 connecting gates of second transfer transistors Tx2 for a plurality of pixels. (3) Third metal-0 layer connecting gates of third transfer transistors Tx3 for a plurality of pixels. (4) Fourth metal-0 layer M04 connecting gates of fourth transfer transistors Tx4 for a plurality of pixels. (5) Fifth metal-0 layer M05 connecting the gates of reset transistors Rx for a plurality of pixels. In embodiments, metal-0 layer M0 may include a sixth metal-0 layer M06 connecting VDDs Rx VDD of the reset transistors for the plurality of pixels.

Figure 4A:
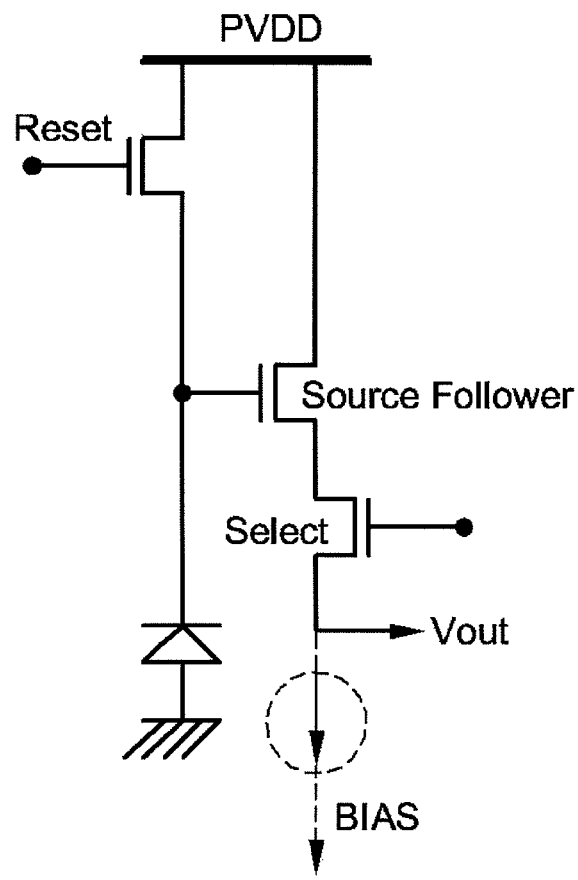
FIG. 4A is an exemplary view of a driving circuit of an image sensor, in accordance with embodiments.
Figure 4B:
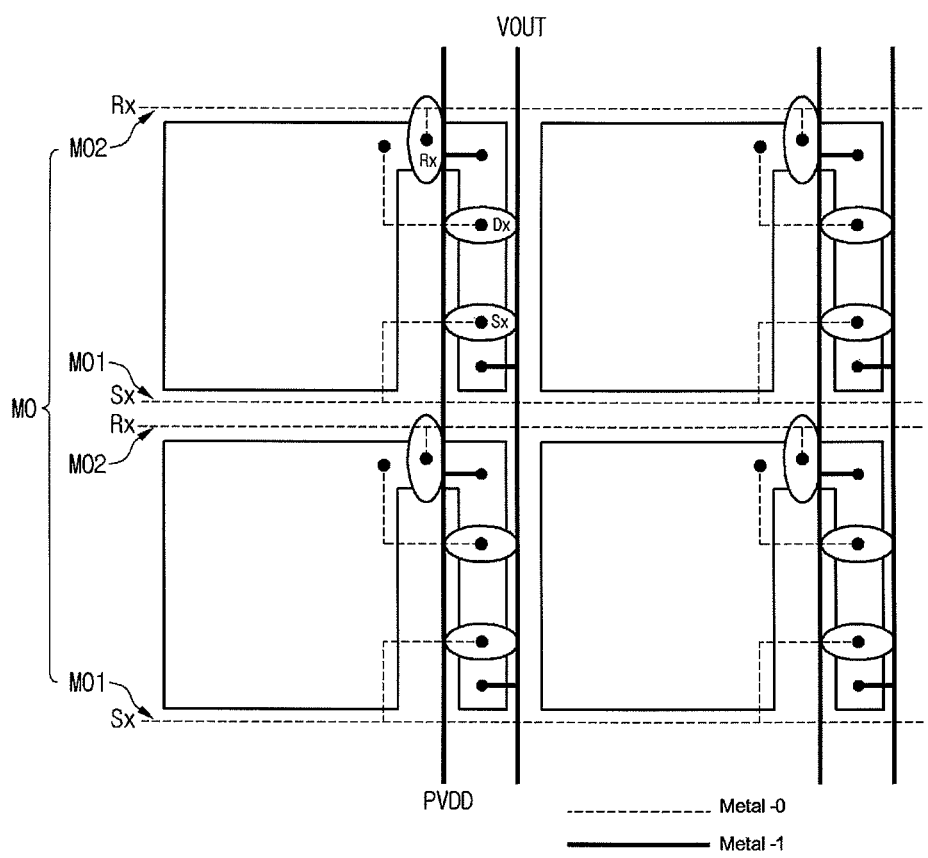
FIG. 4B is an exemplary view of a layout of the image sensor, in accordance with embodiments.

Example FIG. 4A is an exemplary view of a driving circuit of a pixel array and image sensor, in accordance with embodiments. Example FIG. 4B is an exemplary view of a layout of the pixel array and image sensor, in accordance with embodiments. In embodiments, a pixel array may be a unit pixel array including three transistors 3Tr and one photodiode PD. The pixel array may include a reset transistor Rx, a select transistor Sx, or a drive transistor Dx, but other mixes and combinations would be appreciated in embodiments. Metal-0 layer M0 may electrically connect pixel-area transistors of pixels. For example, metal-0 layer M0 may include first metal-0 layer M01 connecting gates of the select transistors Sx for the plurality of pixels and second metal-0 layer M02 connecting gates of the reset transistors Rx for the plurality of pixels.

In embodiments, in a pixel array and image sensor, the distance between a photodiode and microlens may be significantly decreased, thereby significantly improving the sensitivity of the image sensor. For example, in embodiments, a metal-0 layer may be used not as a local interconnection (LIC), but as a global interconnection (GIC), which may allow a pixel layout to be manufactured using only up to a metal-1 layer. Accordingly, the stack height from a photoelectric conversion unit to a light reception unit may be significantly decreased, which may significantly improve the sensitivity of the image sensor. These attributes may be particularly important for a relatively small pixel.

Figure 5A:
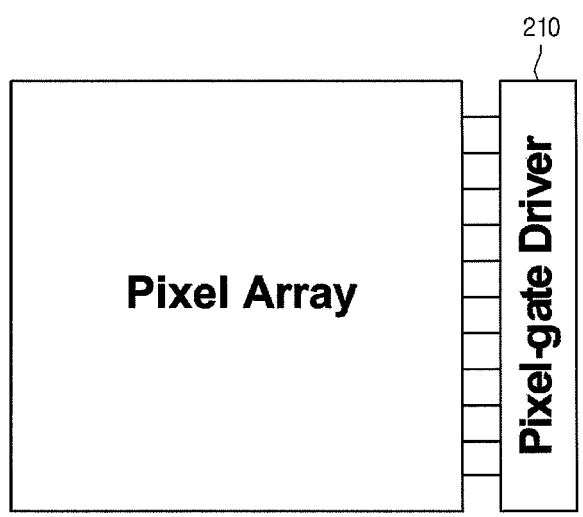
FIG. 5A is a first exemplary view of a configuration of a pixel gate driver of an image sensor, in accordance with embodiments.
Figure 5B:
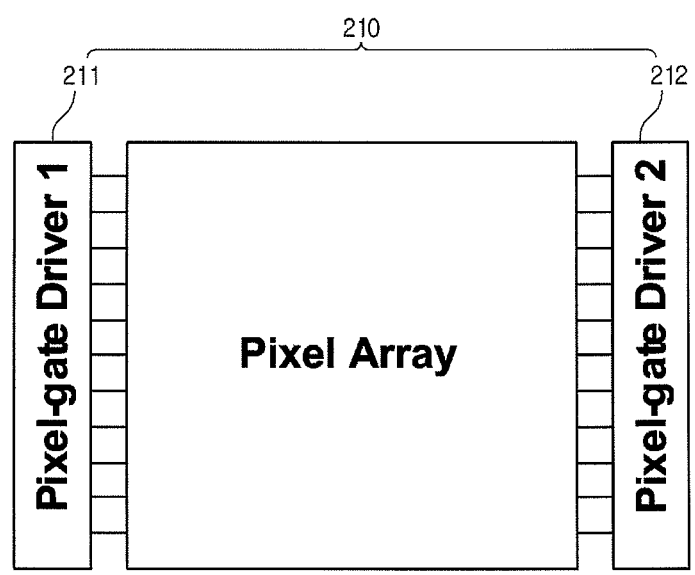
FIG. 5B is a second exemplary view of a configuration of a pixel gate driver of an image sensor, in accordance with embodiments.

Example FIG. 5A is a first exemplary view of a configuration of a pixel gate driver of an image sensor, in accordance with embodiments. Example FIG. 5B is a second exemplary view of a configuration of a pixel gate driver of an image sensor, in accordance with embodiments. Pixel gate driver 210 may be disposed at a side of a pixel array. Gate driver 210 may drive a transistor gate electrode of a pixel array and turn a gate on such that a voltage value for each pixel may be delivered to the pixel. In accordance with embodiments, the pixel gate driver may be disposed in parallel from right to left, which may decrease load resistance and capacitance. For example, pixel gate driver 210 may include first pixel gate driver 211 disposed at one side of the pixel array and a second pixel gate driver 212 disposed at another side of the pixel array. Accordingly, dual gate drivers may be applied to decrease the load resistance and capacitance in a process, thereby driving pixels with high resolution.

Figure 6A:
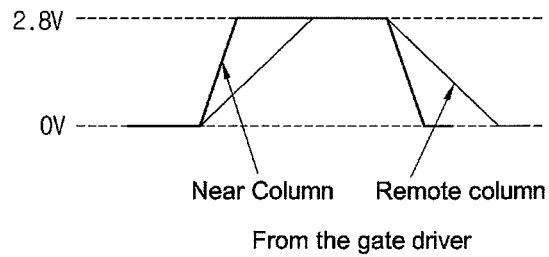
FIG. 6A is an exemplary view illustrating signal distortion in an image sensor, in accordance with embodiments.
Figure 6B:
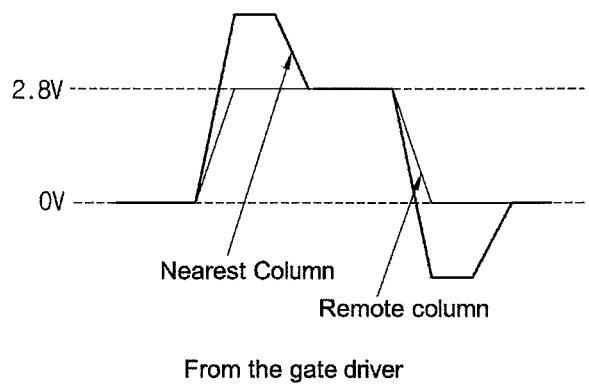
FIG. 6B is an exemplary view applying pre-emphasis in an image sensor, in accordance with embodiments.

Example FIG. 6A is an exemplary view illustrating signal distortion in an image sensor. Example FIG. 6B is an exemplary view applying pre-emphasis in an image sensor, in accordance with embodiments. In embodiments, amplitude in frequency properties may be kept flat by applying a pre-emphasis technique which previously strengthened transmission and weakened reception, thereby driving pixels with high resolution.

Figure 7A:
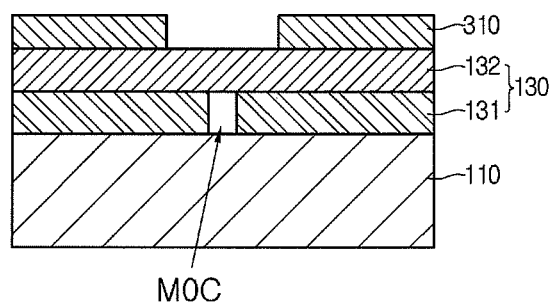
FIGS. 7A to 7F are cross sectional views illustrating some of a manufacturing process in an image sensor, in accordance with embodiments.
Figure 7B:
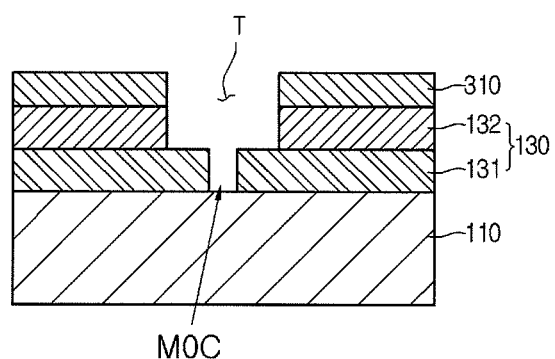
Figure 7C:
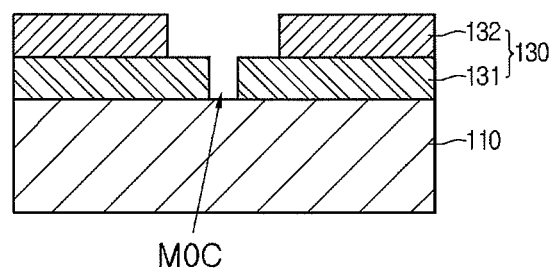
Figure 7D:
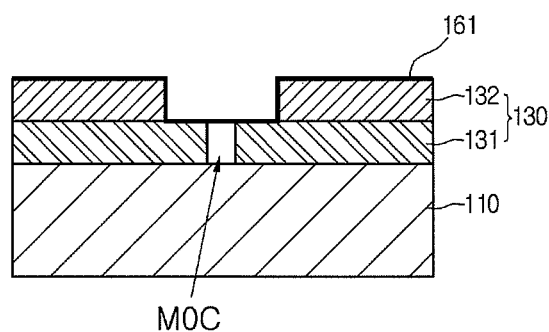
Figure 7E:
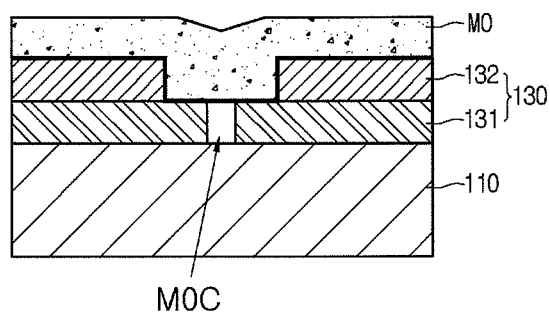
Figure 7F:
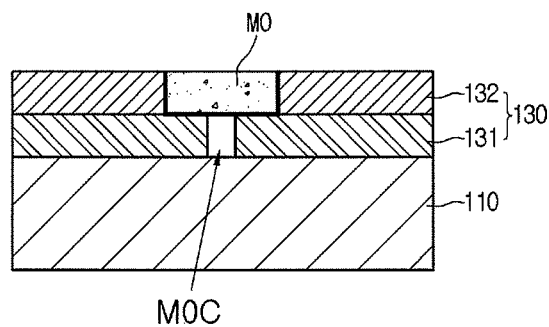

Example FIGS. 7A to 7F are cross sectional views illustrating some of manufacturing processes in an image sensor, in accordance with embodiments. For example, as shown in FIG. 7A, first interlayer dielectric layer 131 may be formed on and/or over substrate 110, and metal-0 contact M0C may be formed in first interlayer dielectric layer 131. Second interlayer dielectric layer 132 may be formed on and/or over metal-0 contact M0C, and predetermined mask pattern 310 may be formed with a photoresist. As shown in FIG. 7B, second interlayer dielectric layer 132 may be partially removed with reactive ion etching to form a trench T and hence expose metal-0 contact M0C. As shown in FIG. 7C, mask pattern 310 may be removed with ashing. As shown in FIG. 7D, barrier metal 161 may be formed on and/or over exposed metal-0 contact M0C and second interlayer dielectric layer 132. As shown in FIG. 7E, metal-0 layer M0 may be formed through a planarization process such as a CMP. In embodiments, metal-0 layer M0 may be formed of tungsten (W), although other materials may be appreciated in accordance with embodiments.

In embodiments, metal-0 layer may be used not as a local interconnection (LIC), but as a global interconnection (GIC), which may allow a pixel layout to be manufactured using only up to the metal-1 layer. Accordingly, since a pixel layout may be implemented using only up to the metal-1 layer, there may be a significant improvement to the sensitivity of the image sensor, which is particularly true for a relatively small pixel. For example, a metal-0 layer may be formed under a metal-1 layer through a tungsten damascene process to be used as a global interconnection (GIC), in accordance with embodiments.

Figure 8A:
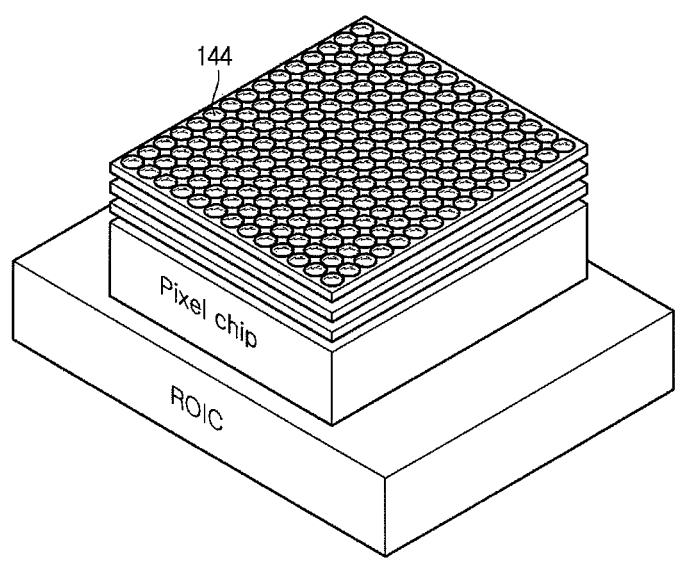
FIG. 8A is a perspective view of an image sensor, in accordance with embodiments.
Figure 8B:
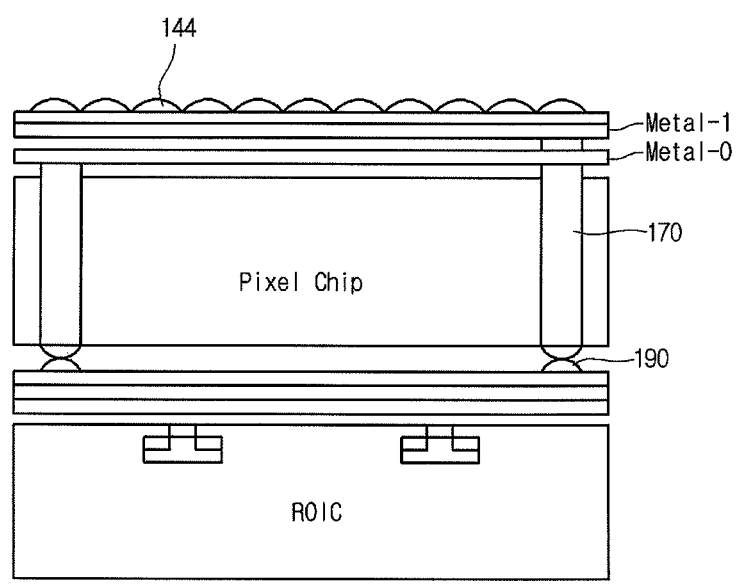
FIG. 8B is a cross sectional view of the image sensor, in accordance with embodiments.

Example FIG. 8A is a perspective view of an image sensor, in accordance with embodiments. Example FIG. 8B is a cross sectional view of the image sensor, in accordance with embodiments. According to embodiments, a pixel chip may use similar technical features as the pixel arrays discussed above in other embodiments. In embodiments, an image sensor may be disposed under a pixel chip including a pixel array.

In embodiments, the image sensor may include a readout IC (ROIC) electrically connected with the pixel array. A through via 170 may be formed in contact with metal-1 layer M1 of the pixel array and electrically connected with the readout IC. The pixel chip and the readout IC may be combined by solder ball 190, although substitutes for a solder ball are appreciated in accordance with embodiments.

In embodiments, a multi-chip module (MCM) package may be implemented between a wafer chip (WF) where only a pixel process is progressed and a wafer chip (WF) where only a readout IC is manufactured. A process for removing an interlayer dielectric layer of a pixel array area (e.g. trench etching) may be omitted from the pixel process, which may result in thereby implementing more optimized processes. In embodiments, a wafer chip process of a pixel area may be possible through processing only up to the metal-1 layer. Since a through-silicon-via landing may be possible for a wiring for the metal-0 layer, additional metal wiring may not be needed, in accordance with embodiments.

Accordingly, an image sensor of a multichip module package (PKG) type may be implemented between a chip wafer (chip/WF) having only a readout IC and a chip wafer (chip/WF) having only a pixel block, in accordance with embodiments. For example, in accordance with embodiments, a metal-0 layer may be used as an etch stop layer for a through-silicon-via TSV, thereby implementing an image sensor of a multichip module PKG type between the two chip wafer (chip/WF) after separately manufacturing the pixel block and the readout IC.

Figure 9:
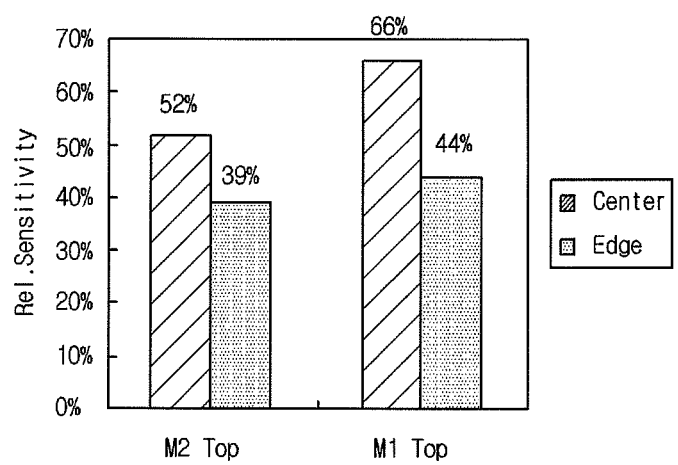
FIG. 9 is a view illustrating sensitivity improvement in a pixel array and image sensor, in accordance with embodiments.

Example FIG. 9 is a view illustrating sensitivity improvement in a pixel array and image sensor, in accordance with embodiments. According to embodiments, when a metal 1 is a top metal M1 Top, the sensitivity improves significantly not only in an edge area but in a center area, compared with an arrangement where the metal 2 is a top metal M2 Top.

According to embodiments, in a pixel array and an image sensor, the distance between the photodiode and microlens may be significantly decreased, thereby significantly improving the sensitivity of the image sensor. For example, according to embodiments, the distance between a photodiode and a microlens is decreased considerably, thereby significantly improving the sensitivity of the image sensor.

For example, according to embodiments, a metal-0 layer may be used not as a local interconnection (LIC), but as a global interconnection (GIC), and thus a pixel layout may be manufactured using only up to the metal-1 layer. Accordingly, the stack height from a photoelectric conversion unit to a light reception unit may be decreased significantly, thereby improving the sensitivity of the image sensor, which may be particularly true for a relatively small pixel, according to embodiments. For example, a metal-0 layer may be formed under a metal-1 layer through a tungsten damascene process to be used as a global interconnection (GIC). Pixels with high resolution may be driven, adding a dual gate driver and/or pre-emphasis, according to embodiments. In embodiments, only up to a process of forming a metal-1 layer may be needed in pixel block production, thereby improving production cost. In embodiments, an image sensor of a multichip module package (PKG) type may be implemented between a chip wafer (chip/WF) having only a readout IC and a chip wafer (chip/WF) having only a pixel block.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A pixel array comprising a plurality of pixels and having a pixel area and a logic area, each pixel comprising:
   a photoelectric conversion unit in the pixel area;
   pixel-area transistors in the pixel area adjacent to the photoelectric conversion unit and comprising a reset transistor, a drive transistor, and a select transistor;
   a first metal layer interconnecting the pixel area transistors, wherein the first metal layer comprises a reset signal, a select signal, a first gate connection connecting a gate of the select transistor to the select signal, and a second gate connection connecting a gate of the reset transistor to the reset signal;
   a second metal layer over the first metal layer, wherein the second metal layer is an uppermost metal layer of the pixel area; and
   a light reception unit over the second metal layer,
   wherein no metal layer exists between the second metal layer and the light reception unit, and no metal layer exists between the first metal layer and the second metal layer.

2. The pixel array according to claim 1, wherein the first metal layer electrically connects the pixel area transistors of adjacent ones of the pixels.

3. The pixel array according to claim 1, wherein the first metal layer has a thickness of about 500 Å to about 2,000 Å.

4. The pixel array according to claim 3, wherein the photoelectric conversion unit comprises a first photodiode and a second photodiode, the pixel area transistors comprise a first transfer transistor, a second transfer transistor, the reset transistor, and the select transistor, and the first metal layer comprises:
   a first metal interconnection connecting each gate of the first transfer transistor;
   a second metal interconnection connecting each gate of the select transistor;
   a third metal interconnection connecting each gate of the second transfer transistor; and
   a fourth metal interconnection connecting each gate of the reset transistor.

5. The pixel array according to claim 4, wherein each pixel comprises a floating diffusion area shared by the first and second photodiodes.

6. The pixel array according to claim 5, wherein the first and second transfer transistors are electrically connected to the floating diffusion area via the first or second metal layer.

7. The pixel array according to claim 3, wherein the photoelectric conversion unit comprises first and second photodiodes, the pixel area transistors comprise a first transfer transistor, a second transfer transistor, a third transfer transistor, a fourth transfer transistor, the reset transistor, and the drive transistor, and the first metal layer comprises:
   a first metal interconnection connecting each gate of the first transfer transistor;
   a second metal interconnection connecting each gate of the second transfer transistor;
   a third metal interconnection connecting each gate of the third transfer transistor;
   a fourth metal interconnection connecting each gate of the fourth transfer transistor; and
   a fifth metal interconnection connecting each gate of the reset transistor.

8. The pixel array according to claim 1, wherein no metal layer exists between the second metal layer and the light reception unit, and no metal layer exists between the first metal layer and the second metal layer.

9. The pixel array according to claim 1, wherein the first metal layer functions as a global interconnection (GIC) for electrically connecting the pixel area transistors.

10. The pixel array according to claim 1, wherein an output of the select transistor is connected to the second metal layer.

11. An image sensor comprising:
    a pixel array comprising a plurality of pixels and having a pixel area and a logic area wherein each of the pixels comprises:
      a photoelectric conversion unit in the pixel area;
      pixel-area transistors in the pixel area adjacent to the photoelectric conversion unit and comprising a reset transistor, a drive transistor, and a select transistor;
      a first metal layer interconnecting the pixel area transistors, wherein the first metal layer connects (i) a gate of the select transistor to a corresponding select driver and (ii) a gate of the reset transistor to a corresponding reset driver;
      a second metal layer over the first metal layer, wherein the second metal layer comprises a drive signal and a third gate connection connecting a gate of the drive transistor to the drive signal, and the second metal layer is an uppermost metal layer of the pixel area; and
      a light reception unit over the second metal layer, wherein no metal layer exists between the second metal layer and the light reception unit, and no metal layer exists between the first metal layer and the second metal layer.

12. The image sensor according to claim 11, further comprising:
a first pixel gate driver at one side of the pixel array; and
a second pixel gate driver at another side of the pixel array.

13. The image sensor according to claim 11, further comprising a readout IC under a pixel chip including the pixel array, and the readout IC is electrically connected with the pixel array.

14. The image sensor according to claim 13, further comprising a through via making contact with the second metal layer of the pixel array and electrically connected with the readout IC.

15. The image sensor according to claim 11, wherein the first metal layer electrically connects the pixel area transistors of adjacent ones of the pixels.

16. The image sensor according to claim 11, wherein the first metal layer has a thickness of approximately 500 Å to approximately 2,000 Å.

17. The image sensor according to claim 11, wherein the photoelectric conversion unit comprises a first photodiode and a second photodiode, the pixel area transistors comprise a first transfer transistor, a second transfer transistor, the reset transistor, and the select transistor,
wherein the first metal layer comprises:
a first metal interconnection connecting each gate of the first transfer transistor;
a second metal interconnection connecting each gate of the select transistor,
a third metal interconnection connecting each gate of the second transfer transistor; and
a fourth metal interconnection connecting each gate of the reset transistor.

18. The image sensor according to claim 17, wherein each pixel comprises a floating diffusion area shared by the first and second photodiodes.

19. The image sensor according to claim 18, wherein the first and second transfer transistors are electrically connected to the floating diffusion area via the first or second metal layer.

20. The image sensor according to claim 11, wherein the pixel array comprises a first transfer transistor, a second transfer transistor, a third transfer transistor, and a fourth transfer transistor,
wherein the first metal layer comprises:
a first metal interconnection connecting each gate of the first transfer transistor;
a second metal interconnection connecting each gate of the second transfer transistor;
a third metal interconnection connecting each gate of the third transfer transistor;
a fourth metal interconnection connecting each gate of the fourth transfer transistor; and
a fifth metal interconnection connecting each gate of the reset transistor.

* * * * *